United States Patent [19]

Sommen et al.

[11] Patent Number: 4,807,173

[45] Date of Patent: Feb. 21, 1989

[54] FREQUENCY-DOMAIN BLOCK-ADAPTIVE DIGITAL FILTER

[75] Inventors: Petrus C. W. Sommen; Theodoor A. C. M. Claasen; Petrus J. Van Gerwen; Hendrik J. Kotmans, all of Eindhoven, Netherlands

[73] Assignee: U.S. Philips Corporation, New York, N.Y.

[21] Appl. No.: 57,561

[22] Filed: Jun. 3, 1987

[30] Foreign Application Priority Data

Jun. 20, 1986 [NL] Netherlands ............. 8601604

[51] Int. Cl.$^4$ ............................................. G06F 15/31
[52] U.S. Cl. ............................. 364/724.18; 364/724.19
[58] Field of Search ......................................... 364/724

[56] References Cited

U.S. PATENT DOCUMENTS 3,883,726  5/1975  Schmidt ............................. 364/724

OTHER PUBLICATIONS

Clark et al, "A Unified Approach to Time-and Frequency-Domain Realization of FIR Adaptive Digital Filters", *IEEE Trans. on Acoustics, Speech, and Signal Processing*, vol. ASSP-31, No. 5, Oct. 1983, pp. 1073-1083.

Gritton et al, "Echo Cancellation Algorithms", *IEEE ASSP Magazine*, Apr. 1984, pp. 30-38.

Primary Examiner—David H. Malzahn
Attorney, Agent, or Firm—Thomas A. Briody; Jack E. Haken; Anne E. Barschall

[57] ABSTRACT

A frequency-domain block-adaptive digital filter (FDAF) having a finite impulse response of length N for filtering a time-domain input signal in accordance with the overlap-save method includes window means (11) for obtaining modifications (B(p;m)) of the 2N frequency-domain weighting factors (W(p;m)) from correlation products (A(p;m)). A known FDAF of this type contains five 2N-point FFT's, two of which are used in the window means (11). By utilizing a special time-domain window function which can be implemented very efficiently in the window means (11) with the aid of a frequency-domain convolution, a FDAF of this type containing only three 2N-point FFT's is obtained whose convergence properties are comparable to those of the known FDAF containing five 2N-point FFT's.

1 Claim, 2 Drawing Sheets

FREQUENCY-DOMAIN BLOCK-ADAPTIVE DIGITAL FILTER

BACKGROUND OF THE INVENTION

The invention relates to a frequency-domain block-adaptive digital filter having a finite impulse response of length N for filtering a time-domain input signal in accordance with the overlap-save method.

A frequency-domain adaptive filter (FDAF) having such a structure is disclosed in the article "A Unified Approach to Time- and Frequency-Domain Realization of FIR Adaptive Digital Filters" by G. A. Clark et al. in IEEE Trans. Acoust., Speech, Signal Processing, Vol. ASSP-31, No. 5, October 1983, pages 1073-1083, more specifically FIG. 2.

In the field of speech and data transmission, time-domain adaptive filters (TDAF) are used in the majority of cases and in most practical applications these TDAF's are implemented as adaptive transversal filters, in which a "least-mean-square" (LMS) algorithm is used for adapting the weights. When the length N of the impulse response assumes large values, as is the case with applications in the acoustic field, the TDAF implemented as a transversal filter has the disadvantage that the complexity in terms of arithmetic operations (multiplying and adding) per output sample increases linearly with the filter length N. In addition, the TDAF implemented as a transversal filter has a low convergence rate for highly correlated input signals such as speech and certain types of data, since the convergence rate decreases with an increasing ratio of the maximum to minimum eigenvalues of the correlation matrix of the input signal (see, for example, C. W. K. Gritton and D. W. Lin, "Echo Cancellation Algorithms", IEEE ASSP Magazine, April 1984, pp. 30-38, in particular pp. 32/33).

The use of frequency-domain adaptive filters (FDAF) provides the possibility to significantly improve the convergence properties for highly correlated input signals, as for any of the substantially orthogonal frequency-domain components of the input signal the gain factor in the adaptation-algorithm can be normalized in a simple way in accordance with the power of the relevant frequency component. For the most efficient implementation of a FDAF having an impulse response of length N, use is made of Discrete Fourier Transforms (DFT) of length 2N of 2N weighting factors to ensure that circular convolutions and correlations, computed with the aid of DFT's, are equivalent to the desired linear convolutions and correlations when the sectioning method is performed correctly. For large values N the computational complexity can, however, be significantly reduced in terms of arithmetic operations per output sample by utilizing efficient implementations of the DFT known as "Fast Fourier Transform" (FFT), as a result of which this complexity becomes proportional to the logarithm of the filter length N.

There where a TDAF needs only have N weighting factors for an impulse response of length N, the equivalent FDAF must utilize 2N weighting factors. After convergence, the weighting factors of an adaptive digital filter (TDAF and FDAF) will continue to fluctuate around their final values due to the presence of noise or other types of signals superimposed on the reference signal and because of the precision (that is to say word length or number of bits) with which the different signals in the digital filter are represented. With the customary, practically valid assumptions about the statistic independence of the different quantities in the filter, the weighting factors will have the same variances when no use is made of window functions in the adaptation loop of the filter. This implies that at the same convergence rate of the adaptive filter (that is to say the same gain factor in the adaption algorithm) using 2N instead of N weighting factors results in an increase of the final misalignment noise factor of the filter by 3 dB, since the final misalignment noise factor is determined by the sum of the variances of the weighting factors. In practice, the gain factor in the adaptation algorithm is chosen such that a predetermined value of the final misalignment noise factor is not exceeded. In order to compensate for the increase of the final misalignment noise factor in an FDAF, this gain factor must be halved, which causes the convergence rate also to be halved, whereas in the majority of applications a highest possible convergence rate is pursued.

Said article by Clark et al. describes a solution for this problem with reference to FIGS. 2 and 3, the modifications of the 2N frequency-domain weighting factors not being derived directly from the second multiplier means, but by using window means for performing an operation whose time-domain equivalent is a multiplication by a rectangular window function of length 2N which constrains the last N components to be zero. An implementation of this window function in the time-domain requires the use of 2 DFT's, namely an inverse DFT for the transformation to the time-domain and a DFT to effect the transformation to the frequency-domain after multiplication by the time-domain window function. An alternative implementation is based on the consideration that a multiplication in the time-domain is equivalent to a convolution in the frequency-domain with the components of the DFT of length 2N of this time-domain window function. For high values N this alternative implementation in the frequency-domain is not attractive, as its computational complexity per component increases linearly with N, whereas in the first-mentioned time-domain implementation this complexity becomes proportional to the logarithm of N when the 2 DFT's are implemented as FFT's. Thus, a preferred implementation of the known solution results in an FDAF containing a total of 5 DFT's implemented as FFT's.

SUMMARY OF THE INVENTION

The invention has for its object to provide a frequency-domain block-adaptive digital filter of the type defined in the opening paragraph of section (A) whose computational complexity is significantly reduced compared to that of the known FDAF containing 5 DFT's, by utilizing a priori information about the global shape of the impulse response to be modelled, but whose convergence behaviour is comparable to that of the known FDAF containing 5 DFT's.

The frequency-domain block-adaptive digital filter according to the invention is characterized, in that the window means are arranged for convolving the 2N frequency-domain products with a function having one real and two mutually conjugate complex coefficients and corresponding to a time-domain window function $g(k)$ of length 2N defined by:

$$g(k) = (\tfrac{1}{2})[1 + \cos((k-k_o)\pi/N)]$$

for k=0, 1, . . . , 2N−1, where $k_o$ is a constant with $0 \leq k_o < N$

SHORT DESCRIPTION OF THE DRAWINGS

The invention and its advantages will now be described in greater detail by way of example with reference to the accompanying drawings. Therein:

DESCRIPTION OF THE EMBODIMENTS

Figure 1:
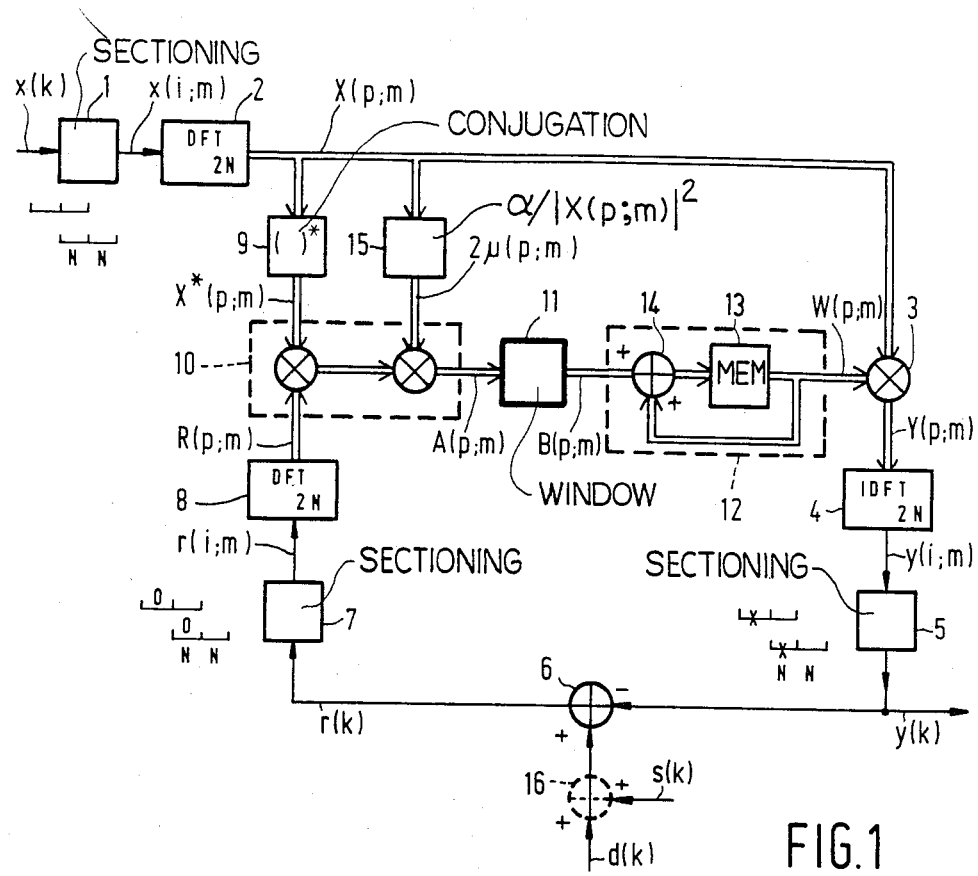
FIG. 1 shows the general block diagram of an FDAF including window means and utilizing the overlap-save method.

FIG. 1 shows the general block diagram of an FDAF having a finite impulse response of length N for filtering a time-domain digital input signal x(k) in accordance with the overlap-save method. Double-line signal paths in FIG. 1 indicate paths in the frequency-domain and single-line signal paths indicate paths in the time-domain. Transformation from the time-domain to the frequency-domain and vice-versa is effected with the aid of the Discrete Fourier transform (DFT) and the Inverse Discrete Fourier transform (IDFT), respectively, both having a length 2N. In literature these transforms are known as 2N-point DFT's, wherein "point" may refer to both a discrete time-domain component and to a discrete frequency-domain component. To differentiate between time-domain and frequency-domain signals, time-domain signals are written in lower-case letters and frequency-domain signals in upper-case letters.

The FDAF shown in FIG. 1 has for its object to derive, at discrete instants k, from the input signal x(k) an output signal y(k) which equals a reference signal d(k) as well as possible. In many case, for example, when the FDAF forms part of an echo cancellor, this reference signal d(k) may be assumed to be the linear convolution of the input signal x(k) with an impulse response h(k) of length N whose shape is not accurately known. Then the FDAF has for its task to make its impulse response w(k) equal to this impulse response h(k) as well as possible.

To that end, in FIG. 1 the input signal x(k) is applied to sectioning means 1 in order to be segmented into blocks of length 2N with the aid of serial-to-parallel conversion, each block overlapping its preceding block over a length N, as is shown symbolically in FIG. 1. The points of the input signal block having block number m are denoted as x(i;m) with i=0, 1, . . . , 2N−1. With the aid of transformation means 2 for performing a 2N-point DFT each input signal block is transformed to the frequency-domain, the frequency-domain points of block m thus obtained being denoted as X(p;m) with p=0, 1 . . . , 2N−1. In multiplier means 3 each frequency-domain component X(p;m) is multiplied with an associated frequency-domain weighting factor W(p;m) for forming products X(p;m) W(p;m) representing the frequency-domain components Y(p;m) of the output signal block m. With the aid of transformation means 4 for performing an inverse 2N-point DFT each output signal block is transformed to the time-domain, the resultant time-domain points of block m being denoted shown as y(i;m) with i=0, 1, . . . 2N−1. Since the weighting factors W(p;m) may be considered as being points of a 2N-point DFT performed on time-domain weighting factors w(i;m) which represent values of the impulse response w(k) during block m, the multiplication in multiplier means 3 in the time-domain corresponds to the circular convolution of the input signal x(k) during block m with the impulse response w(k) during block m. The desired time-domain output signal y(k) is, however, the linear convolution of x(k) with w(k). In accordance with the overlap-save method, this desired output signal y(k) is obtained by applying the time-domain components y(i;m) of this circular convolution for each block to sectioning means 5 in which, using parallel-to-serial conversion, the first N point y(i;m) with i=0, 1, . . . , N−1 are discarded and the last N points y(i;m) with i=N, N+1, . . . , 2N−1 are passed on as the output signal y(k), as is symbolically shown in FIG. 1.

For the adaptation of the frequency-domain weighting factors W(p;m) on a block-by-block basis, use is made of a "least mean-square" (LMS) algorithm. In accordance with this algorithm, these weighting factors W(p;m) are modified as long as there is correlation between the input signal x(k) and an error signal r(k) given by the difference between the reference signal d(k) and the output signal y(k). This differential signal r(k)=d(k)−y(k) is obtained with the aid of an adder 6. The overlap-save method for determining this correlation between the signals x(k) and r(k) implies that in FIG. 1 the error signal r(k) is applied to sectioning means 7 in order to be segmented into blocks of length 2N with the aid of serial-to-parallel conversion, each block overlapping its preceding block over a length N and the forst portion of length N of each block being constrained to be zero, as is symbolically shown in FIG. 1. The points of error signal block m are denoted as r(i;m) with i=0, 1, . . . , 2N−1, it holding for i=0, 1, . . , N−1 that r(i;m)=0. Using transformation means 8 for performing a 2N-point DFT each error signal block is transformed to the frequency-domain, the frequency-domain points of block m thus obtained being denoted as R(p;m) with p=0, 1, . . . , 2N−1. In addition, the frequency-domain components X(p;m) of input signal block m are applied to conjugation means 9 for producing the complex conjugate value X*(p;m) of each component X(p;m). Each conjugated component X*(p;m) is multiplied in multiplier means 10 with the associated component R(p;m) for forming frequency domain products X*(p;m) R(p;m) which correspond to the time-domain correlation between the input signal x(k) and the error signal r(k) during block m. In addition, each product X*(p;m) R(p;m) is multiplied by an amount 2μ(p;m), where μ(p;m) is the gain factor in the adaptation algorithm, as a result of which a product A(p;m);32 2μ(p;m) X*(p;m) R(p;m) is formed which determines the modification of the frequency-domain weighting factor W(p;m). In the FDAF shown in FIG. 1, these products A(p;m) are applied to window means 11 for obtaining the ultimate modifications B(p;m) of the weighting factors W(p;m) which are formed by means of accumulator means 12. These accumulator means 12 include a memory 13 for storing the weighting factors W(p;m) of block m and an adder 14 for forming the sum of each weighting factor W(p;m) and its associated modification B(p;m), this sum being stored in memory 13 for providing the weighting factors W(p;m+1) for the subsequent block (m+1).

For performing its main function (effecting that its impulse response w(k) converges to the impulse response h(k) to be modelled, an FDAF utilizing the overlap-save method need not to include the window means 11 of FIG. 1. In that case the modifications B(p;m) of the weighting factors W(p;m) are given by the products A(p;m) and the adaptation algorithm may be written as:

$$W(p;m+1) = W(p;m) + 2\mu(p;m)X^*(p;m)R(p;m) \quad (1)$$

When the input signals are not or only weakly correlated, the gain factor $\mu(p;m)$ for each weighting factor W(p;m) may have the same constant value $\alpha$ which is independent of the block number m (this constant $\alpha$ is known as the adaptation factor of the algorithm). For highly correlated input signals the convergence rate can be significantly increased by decorrelating these input signals, which can be effected by normalizing their power spectrum (see, for example, the aforementioned article by Gritton and Lin, page 36). Since the frequency-domain components X(p;m) are already available in an FDAF, the normalization can be effected in a simple way by making the gain factor $\mu(p;m)$ equal to the adaptation factor divided by the power $|X(p;m)|^2$ of the relevant component X(p;m):

$$\mu(p;m) = \alpha/|X(p;m)|^2 \quad (2)$$

This possibility is shown in FIG. 1 by including means 15 in which for each applied component X(p;m) the righthand side of formula (2) is determined which, optionally after smoothing on a block-by-block basis, with the aid of a simple recursive filter, is used as a gain factor $\mu(p;m)$ for multiplying by $2\mu(p;m)$ in the multiplier means 10.

As has already been mentioned in the foregoing, an FDAF must utilize 2N-point DFT's and 2N frequency-domain weighting factors W(p;m) for providing an impulse response w(k) of a length N. These weighting factors W(p;m) may be considered to be the points of a 2N-point DFT performed on 2N time-domain weighting factors w(i;m). This creates a problem because the FDAF has only N time-domain weighting factors w(i;m) which represent the N values w(k) with k=0, 1, ..., N−1 of the impulse response of the FDAF, so that the remaining N time-domain weighting factors w(i;m) with i;32 N, N+1, ..., 2N−1 are actually superfluous. It is likewise described that, after convergence, the 2N weighting factors W(p;m) and consequently also the 2N weighting factors w(i;m) will continue to fluctuate around their final values as a result of the finite precision of the signal representation in the FDAF and because of the presence of noise and any other types of signals superimposed on the reference signal d(k). This superpositioning is symbolically shown in FIG. 1 by a broken-line adder 16 inserted in the path of the reference signal d(k) and receiving a signal s(k) representing noise and any other type of signals. The variances of the fluctuating weighting factors will all have the same value when the FDAF does not include window means 11 and the gain factors have been chosen in the manner described in the preceding paragraph. An important parameter for the convergence behaviour of a block-adaptive filter (FDAF and TDAF) is the ratio $\beta(m)$ of the variance of the residual signal d(k)−y(k) in block m to the variance of the signal s(k) superimposed on signal d(k) in block m. The final value $\beta$ after convergence is known as final misalignment noise factor and this final value $\beta$ is predominantly determined by the sum of the weighting factor variances (at the customary values of the adapatation factor $\alpha$). The fact that N out of the 2N time-domain weighting factors w(i;m) of the FDAF are actually superfluour implies that the final value $\beta$ for the FDAF is indeed unnecessarily higher by a factor of two (3 dB) than the final value $\beta$ for the equivalent TDAF having only N time-domain weighting factors. For the customary values of the adaptation factor $\alpha$ this final value $\beta$ is substantially proportional to $\alpha$ and the same holds for the convergence rate of $\beta(m)$ as long as $\beta(m)$ is much greater than $\beta$. In practice, the adaptation factor $\alpha$ is chosen such that a predetermined final value $\beta$ is not exceeded. This implies that the adaptation factor $\alpha$ for the FDAF must actually be halved unnecessarily to satisfy this prescription resulting in the convergence rate also being halved, which is undesirable.

Figures 2A, 2B:
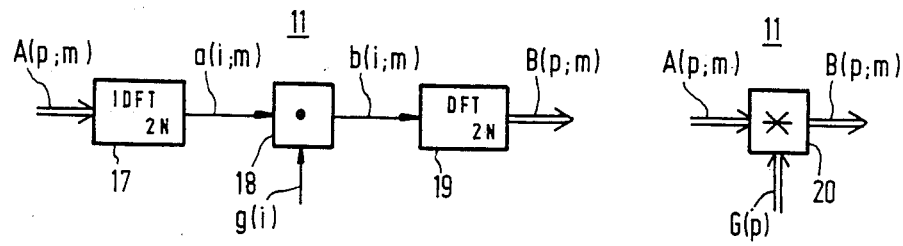
FIGS. 2a and 2b show the block diagram of the window means for the implementation of a window function in the time-domain and the implementation, equivalent thereto, in the frequency-domain, respectively.

This problem can be solved by including the window means 11 in the FDAF of FIG. 1. In accordance with the article by Clark et al. mentioned in the foregoing, these window means 11 can be arranged for performing an operation on the frequency-domain products A(p;m) supplied by multiplier means 10 that is equivalent to multiplying the associated time-domain products a(i;m) with a rectangular window function of length 2N which forces the last N time-domain products a(i;m) to be zero. FIGS. 2a and 2b show the block diagram of these window means 11 such as they are described in the article by Clark et al. (see FIG. 3). In the window means 11 of FIG. 2a the time-domain window function g(k) is realized with the aid of transformation means 17 for performing an inverse 2N-point DFT converting the 2N frequency-domain products A(p;m) into the 2N associated time-domain products a(i;m), a multiplier 18 multiplying each time-domain product a(i;m) with the value g(i) of window function g(k) for k=i to obtain 2N time-domain products b(i;m)=g(i) a(i;m) and transformation means 19 for performing a 2N-point DFT converting the 2N time-domain products b(i;m) into the associated 2N frequency-domain products B(p;m). These products B(p;m) constitute the modifications of the 2N frequency-domain weighting factors W(p;m) applied to the accumulator means 12 of FIG. 1. The window means 11 of FIG. 2b are based on the consideration that multiplying by g(i) in the time-domain as performed in FIG. 2a is equivalent to a convolution in the frequency-domain and consequently consist of convolution means 20 for performing the (circular) convolution of the frequency-domain products A(p;m) with the frequency-domain components G(p) obtained by effecting a 2N-point DFT on the 2N points g(i) of the time-domain window function g(k) for k=i.

Figure 3A:
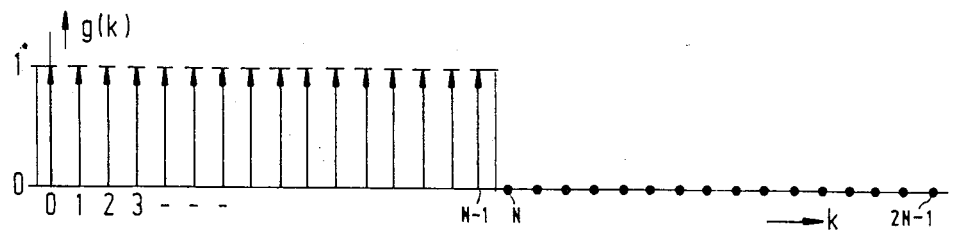
FIGS. 3a and 3b show the time-domain window function according to the afore-mentioned prior art and the invention, respectively.

The rectangular window function g(k) of length 2N as described in the article by Clark et al. is given by the formula:

$$g(k) = \begin{cases} 1 & k = 0, 1, \ldots, N-1 \\ 0 & k = N, N+1, \ldots, 2N-1 \end{cases} \quad (3)$$

and is shown in FIG. 3a. For the sake of simplicity, the influence of this window function g(k) on the convergence behaviour of the FDAF will now be described in greater detail for the case in which the window means 11 of FIG. 1a are used in FIG. 1 and the memory 13 has zero content at the beginning of the adaptation. This last fact implies that for m=0 the 2N frequency-domain weighting factors W(p;m) satisfy W(p;0)=0 and consequently the associated time-domain weighting factors w(i;m) also satisfy w(i0)=0. each of the 2N weighting factors w(i;m) for m≠0 may be considered to be the result of the block-by-block accumulation of its time-domain modifications starting from m=0 and when the window means 11 of FIG. 2a are used, these time-domain modifications are formed by the products b(i;m)=g(i)a(i;m) at the output of multiplier 18. By using window function g(k) as defined by formula (3), the modifications b(i;m) with i=N, N+1, ..., 2N−1 and m=0, 1, 2, ... are constrained to be zero and consequently the weighting factors w(i;m) with i=N, N+1, ..., 2N−1 for m≠0 are also constrained to be zero because then w(i;m)=w(i;0) for these values i and because it holds for all values i that w(i;0)=0. This implies that of the 2N weighting factors w(i;m) of the FDAF the N actually superfluous weighting factors w(i;m) with i=N, N+1, ..., 2N−1 will not fluctuate around the constrained value zero and consequently will not contribute to the final value $\beta$ of the parameter $\beta(m)$. Halving the adaptation factor $\alpha$, necessary in the FDAF without window means 11 to prevent a prescribed final value $\beta$ from being exceeded, needs consequently not to be effected in the FDAF including window means 11 for realizing window function g(k) in accordance with formula (3) and consequently there is also no need to halve the convergence rate.

The convergence behaviour of the described FDAF's will now be illustrated with reference to simulation results for the case in which the impulse response h(k) of length N=32 to be modelled has the global shape of an exponentially decreasing function, the input signal x(k) is a pseudo-ternary data signal in accordance with the AMI-code and is, therefore, a highly correlated signal, the value $\beta=2^{-6}(=-18$ dB) is chosen as the prescribed final value of the parameter $\beta(m)$ and the value $\beta(0)=2^7(=+21$ dB) is chosen as the initial value. The simulation results are represented in a highly stylized form in FIG. 4, which shows the parameter $\beta(m)$ as a function of the number m of the iterations of the adaptation algorithm. This stylizing relates to both the convergence rate of $\beta(m)$ and also to the details of the variations of $\beta(m)$ for consecutive values of m. More specifically, the convergence rate of $\beta(m)$ in FIG. 4 has a constant value until the final value $\beta$ is reached and thereafter has zero value, whereas this convergence rate is actually already noticeably smaller at values of $\beta(m)=2^{-2}(=-6$ dB) than at the initial value $\beta(0)$ and still further decreases at still lower values of $\beta(m)$; and, additionally, the details of the variation of $\beta(m)$ for consecutive values of m have been omitted in FIG. 4 to prevent the noisy character of these details from obscuring the image of the global shape of $\beta(m)$ to too high an extent.

Figure 4:
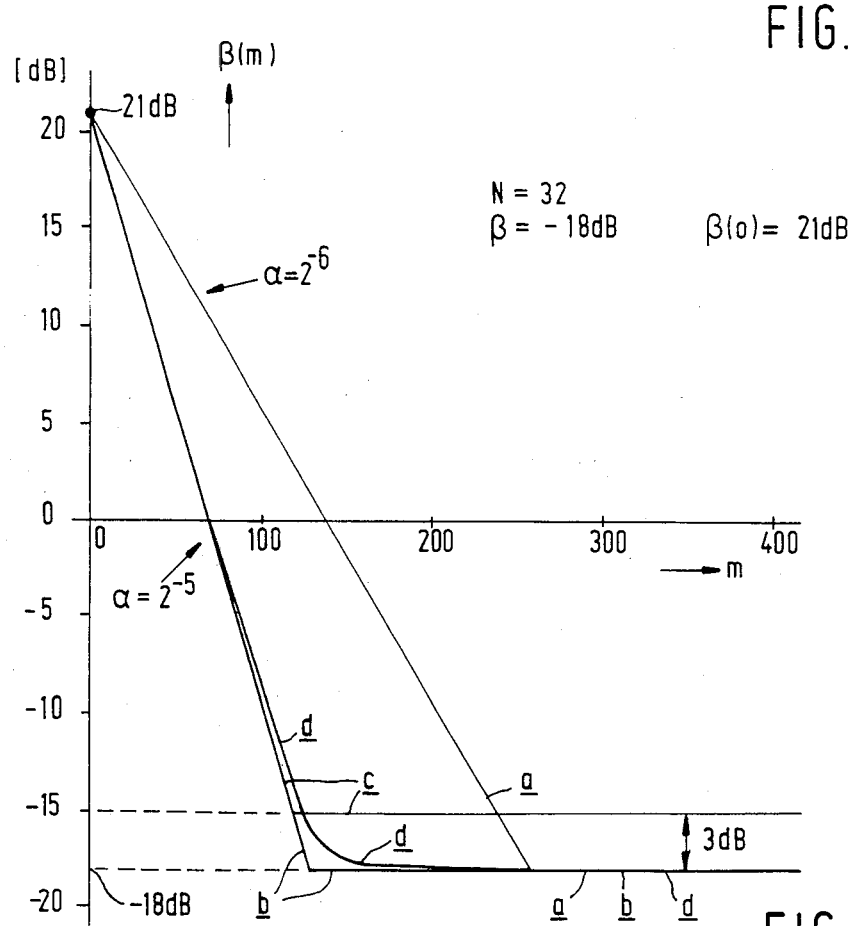
FIG. 4 is a time diagram to illustrate the convergence behaviour of an FDAF in accordance with the afore-mentioned prior art and the invention, respectively.

Curve a in FIG. 4 relates to the FDAF without window means 11, the adaptation factor having a value $\alpha=2^{-6}$ for reaching the prescribed final value $\beta=-18$ dB. Curve b in FIG. 4 relates to the FDAF including window means 11 for implementing window function g(k) as defined in formula (3), the adaptation factor having a value $\alpha=2^{-5}$ for reaching the prescribed final value $\beta=-18$ dB; this adaptation factor $\alpha$ has a twice higher value than for the case in which the FDAF does not include window means 11. When this twice higher value $\alpha=2^{-5}$ is also used in the FDAF without window means 11, $\beta(m)$ varies in accordance with curve c in FIG. 4 which coincides with curve b until (m) has reached the value $\beta(m)=-15$ dB, which at this value of $\alpha$ constitutes the final value $\beta$; consequently this final value $\beta=-15$ dB exceeds the prescribed final value $\beta=-18$ dB by 3 dB.

As regards the practical implementation of window means 11 for providing window function g(k) as defined by the formula (3), the embodiment of FIG. 2a should be preferred over the embodiment of FIG. 2b, more specifically for large values N, as the computational complexity, expressed in the number of real multiplications and additions required for obtaining the 2N modifications B(p;m) of the weighting factors W(p;m), is in the case of FIG. 2a of a lower order than for the case illustrated in FIG. 2b. FIG. 2a requires two 2N-point DFT's which can efficiently be implemented as 2N-point FFT's, so that for large values N the number of arithmetic operations is of the order N log(N), the multiplication by g(k) in multiplier 18 not contributing to this number of operations since g(k) only assumes the values 1 and 0. In FIG. 2b the 2N values A(p;m) are convolved with the values G(p) obtained by performing a 2N-point DFT on the 2N points g(i) of g(k) in accordance with formula (3) for k=i. As can be easily checked, G(p) has the value G(p)=0 for p=2, 4, 6, ... and a value G(p)≠0 for p=0 and p=1, 3, 5, ... So FIG. 2b requires the convolution of 2N values A(p;m) with (NO1) values G(p), so that for large values N the number of arithmetic operations is of the order of $N^2$ and consequently of a higher order than for the case illustrated in FIG. 2a.

The FDAF's described so far do not utilize a priori information about the usually well-known global shape of the impulse response h(k) to be modelled and only utilize the a priori information about the length N of this impulse response. In contrast thereto, the FDAF according to the invention does indeed utilize a priori information about the global shape of the impulse response h(k) to be modelled, as usually it is not only known of this impulse response h(k) that the N values h(k) for k=0, 1, ..., N−1 differ significantly from zero and are substantially zero for k≧N, but it is also roughly known for which values k the largest amplitudes |h(k)| occur. In addition, it is known, that the amplitudes |h(k)| have roughly a decreasing character for values k which increasingly differ from the values k with the largest amplitudes |h(k)|. The invention now utilizes this a priori information by arranging the window means 11 for providing a time-domain window function g(k) of a length 2N which is given by the formula:

$$g(k)=(\tfrac{1}{2})[1+\cos((k-k_o)\pi/N)] \qquad (4)$$

for k=0, 1, ... m 2N−1, where $k_o$ is a constant with $0\leq k_o<N$. By choosing this constant $k_o$ in the range of values k having the largest amplitudes |h(k)| it is accomplished that the window function g(k) defined in formula (4) has the same global shape as the impulse response h(k) to be modelled. In addition, the window means 11 are arranged for implementing the window function g(k) defined by formula (4) in the frequency-domain, that is to say for the convolution of the 2N frequency-domain products A(p;m) produced by multiplier means 10 in FIG. 1 with the frequency-domain components G(p) obtained by effecting a 2N-point DFT on the 2N points g(i) of g(k) defined by formula (4) for k=i. As is easy to check, G(p) has the following values:

$$G(0) = N$$

$$G(1) = (N/2)[\cos(k_o\pi/N) - j\sin(k_o\pi/N)]$$

$$G(2N-1) = (N/2)[\cos(k_o\beta/N) + j\sin(k_o\pi/N)] \quad (5)$$

$$G(p) = 0, \quad 2 \leq p \leq 2N-2 \quad (5)$$

Implementing time-domain window function g(k) defined in formula (4) in the frequency-domain with the aid of window means 11 as shown in FIG. 2b consequently requires the convolution of 2N values A(p;m) with only 3 values G(p), namely the real value G(0) and the mutually conjugate complex values G(1) and G(2N−1), so that for high values N the number of arithmetic operations required for the 2N modifications B(p;m) of the weighting factors W(p;m) is only of the order N and consequently not of the order N², as in the case of the known window function g(k) as defined in formula (3). Using the measures according to the invention consequently accomplishes a significant reduction of the computational complexity. In this respect it should be noted that this reduction of the computational complexity is not achieved when the window function g(k) of formula (4) is implemented with the aid of window means 11 as shown in FIG. 2a, because multiplying by g(k) then indeed contributes to the number of arithmetic operations, but particularly because the computational complexity of the two 2N-point DFT's implemented as FFT does not change, so that for large values N the number of computational operations remains of the order N log(N).

Now it will be explained that compared to the preferred embodiment of the known FDAF with a total of 5 2N-point DFT's implemented as FFT the significant reduction in the computational complexity of the FDAF according to the invention is not accompanied be a deterioration in the convergence behaviour. For simplicity, this explanation will be given with reference to observations in the time-domain.

In the foregoing it has already been stated that the FDAF actually has 2N time-domain weighting factors w(i;m) with i=0, 1, ..., 2N−1. When the FDAF does not include window means 11 and the gain factors μ(p;m) have been chosen in accordance with formula (2), the rate at which a weighting factor w(i;m) converges to the associated value h(i) of the impulse response h(k) to be modelled, will have for all weighting factors w(i;m) the same value which is proportional to the adaptation factor α. Because of the use of time-domain window functions g(k) the convergence rate of a weighting factor w(i;m) becomes proportional to g(i). The convergence rate of the FDAF is a function of the convergence rate of all the weighting factors w(i;m), but will predominantly be determined by the convergence rate of those weighting factors w(i;m) which have to converge to the highest values h(i) of the impulse response h(k) to be modelled. By now choosing the constant $k_o$ in formula (4) in the range of the values k having the largest amplitudes |h(k)| it is accomplished that the value g(k) in that range is substantially equal to 1, that is to say it has substantially the same value as in the case in which no window functions g(k) are used (in fact, this latter case can also be characterized by a window function g(k)=1 for k=0, 1, ..., 2N−1). Chossing the window function g(k) in accordance with formula (4) then results in a convergence rate of the FDAF of the invention substantially equal to that of the FDAF without window means 11 when the adaptation factor has the same value for both cases.

Figure 3B:
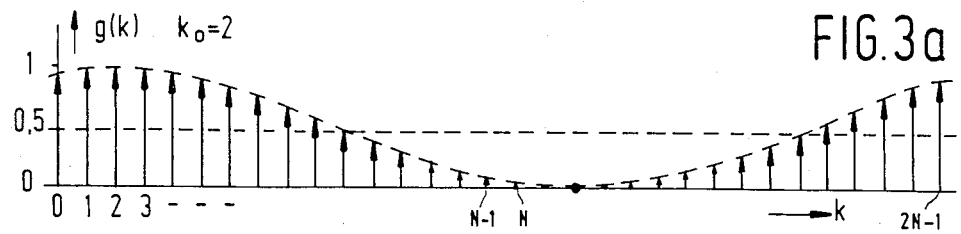

As has also been mentioned in the foregoing, the variance of a weighting factor w(i;m) after convergence has the same value for all the weighting factors w(i;m) when the FDAF does not include window means and the gain factors μ(p;m) have been chosen in accordance with formula (2). For the usual values of the adaptation factor α the value of this variance of w(i;m) is substantially proportional to α. However, when the window function g(k) is used, the variance of a weighting factor w(i;m) after convergence becomes proportional to αg(i). The final value β of the parameter (m) is substantially determined by the sum of the variances of the weighting factors w(i;m) after convergence, so that when the window functions g(k) are used the final value β is substantially proportional to the quantity $$\alpha \sum_{i=0}^{2N-1} g(i) \quad (6)$$

for the customary values of the adaptation factor α. For the FDAF without window means 11 the quantity of formula (6) has the value 2αN and for the FDAF with window means 11 this quantity has the value N when the window function g(k) is in accordance with formula (3), but also when the window function g(k) is in accordance with formula (4). This can be checked in a simple manner with reference to formulae (3) and (4), but also by making a comparison between FIG. 3a representing g(k) of formula (3) and FIG. 3b representing g(k) in accordance with formula (4) for $k_o=2$. Using the window functions g(k) as defined in the formulae (3) and (4) consequently results in the same final value β of parameter β(m) when the adaptation factor α has the same value for both cases.

The convergence behaviour of the FDAF according to the invention can again be illustrated on the basis of simulation results for the same case as used to illustrate the convergence behaviour of the known FDAF's. Maintaining the afore-mentioned stylizing, these simulation results are also represented in FIG. 4 by curve d, which relates to the FDAF including window means 11 for implementing a window function g(k) in accordance with formula (4) with $k_o=0$, the adaptation factor having a value $\alpha=2^{-5}$ for obtaining the prescribed final value β=−18 dB. This curve d substantially coincides with curve b in a large range from m=0 onwards and has the same final value β as curve b. Since curve b relates to the known FDAF with window means 11 implementing a window function g(k) as defined in formula (3) and also having an adaptation factor $\alpha=2^{-5}$, FIG. 4 is a clear illustration of the fact that the convergence behaviour of the FDAF according to the invention is in practice fully comparable to the convergence behaviour of this known FDAF. The deviations, shown in a stylized manner in FIG. 4, between curves b and d for low values β(m) are illustrative of the fact that in the final stage the convergence proceeds somewhat slower for curve d than for curve b. This is however of little practical importance, as the convergence in the final stage does indeed proceed slowly and the final value $\beta$ is the same for both curves b and d.

The preceding description can now be summarized as follows. For a FDAF in accordance with the overlap-save method, the article by Clark et al. describes a preferred implementation containing five 2N-point FFT's, two of which are used to constrain the last N-time-domain weighting factors to be zero by using an appropriate window function in the time-domain. By utilizing a priori information about the impulse response to be modelled, the invention provides a FDAF in accordance with the overlap-save method having a special time-domain window function which can be implemented very efficiently in the frequency-domain, the FDAF only containing three 2N-point FFT's, whereas its convergence properties are comparable to those of the prior art implementation containing five 2N-point FFT's.

What is claimed is:

1. A frequency-domain block-adaptive digial filter having a finite impulse response of length N for filtering a time-domain input signal in accordance with the overlap-save method, comprising:

first sectioning means for segmenting the time-domain input signal into blocks of length 2N, each block overlapping its preceding block over a length N;

first transformation means for obtaining 2N frequency-domain components of the Discrete Fourier Transform of length 2N of each input signal block;

first multiplier means for multiplying each of the 2N frequency-domain components with an associated frequency-domain weighting factor for obtaining 2N weighted frequency-domain components;

second transformation means for obtaining 2N time-domain components of the inverse Discrete Fourier Transform of length 2N of the weighted frequency-domain components;

second sectioning means for discarding the first N time-domain components and conveying the last N time-domain components as the time-domain output signal of the filter;

means for generating a time-domain error signal as a difference between the filter output signal and a reference signal;

third sectioning means for segmenting the time-domain error signal into blocks of length 2N, each block overlapping its preceding block over a length N, and for assigning the zero value to the first portion of a length N of each block;

third transformation means for obtaining 2N frequency-domain components of the Discrete Fourier Transform of length 2N of each error signal block;

conjugation means for forming the complex conjugate value of the 2N frequency-domain components produced by the first transformation means;

second multiplier means for multiplying each of the 2N frequency-domain components produced by the third transformation means with the associated frequency-domain component produced by the conjugation means and with a gain factor for obtaining 2N frequency-domain products;

window means for performing an operation on the 2N frequency-domain products, whose time-domain equivalent is a multiplication by a window function, to obtain 2N frequency-domain weighting factor modifications;

accumulator means for accumulating on a block-by-block basis each of the 2N weighting factor modifications for obtaining the 2N frequency-domain weighting factors;

characterized in that the window means are arranged for convolving the 2N frequency-domain products by a function having one real and two mutually conjugate complex coefficients and corresponding to a time-domain window function g(k) of length 2N defined by $$g(k) = (\tfrac{1}{2})[1 + \cos((k-k_0)\pi/N)]$$

for $k = 0, 1, \ldots, 2N-1$, where $k_o$ is a constant with $0 \leq k_o < N$.

* * * * *